United States Patent [19]
Amerasekera

[11] Patent Number: 5,804,860
[45] Date of Patent: Sep. 8, 1998

[54] INTEGRATED LATERAL STRUCTURE FOR ESD PROTECTION IN CMOS/BICMOS TECHNOLOGIES

[75] Inventor: E. Ajith Amerasekera, Plano, Tex.

[73] Assignee: Texas Instruments Incorporated, Dallas, Tex.

[21] Appl. No.: 740,596

[22] Filed: Oct. 31, 1996

Related U.S. Application Data

[60] Provisional application No. 60/007,110 Oct. 31, 1995.
[51] Int. Cl.$^6$ ....................................................... H01L 23/62
[52] U.S. Cl. ..................... 257/361; 257/362; 257/408; 257/930
[58] Field of Search ........................... 257/362, 360, 257/361, 357, 356, 355, 408, 930

[56] References Cited

U.S. PATENT DOCUMENTS

| | | | |
|---|---|---|---|
| 5,021,853 | 6/1991 | Mistry | 257/357 |
| 5,606,191 | 2/1997 | Wang | 257/336 |

FOREIGN PATENT DOCUMENTS

| | | | |
|---|---|---|---|
| 62-286266 | 12/1987 | Japan | 257/361 |
| 63-54762 | 3/1988 | Japan | 257/357 |
| 1199467 | 8/1989 | Japan | 257/357 |
| 5055251 | 3/1993 | Japan | 257/360 |

OTHER PUBLICATIONS

Ogura et al., "Design and Characteristics of the Lightly Doped Drain—Source (LDD) Insulated Gate Field—Effect Transistor", IEEE Transactions on Electron Devices, vol. ED–27, No. 8, Aug. 1980, pp. 1359–1367.

1988 EOS/ESD Symposium Proceedings, Effects of Interconnect Process and Snapback Voltage of the ESD Failure Threshold of NMOS Transistors, pp.212–219, by Kueing–Long Chen.,1988.

1995 IEE International Reliability Physics Proceedings, 33rd Annual, Las Vegas, Nevada, Apr. 4–6, 1995, IEEE Catalog No. 95CH3471–0, "Building–In ESD/EOS Reliability for Sub–Halfmicron CMOS Processes",pp. 276–283, by Carlos H. Diaz, Thomas E. Kopley and Paul J. Marcoux., 1995.

Primary Examiner—William Mintel
Attorney, Agent, or Firm—Mark A. Valetti; Wade James Brady, III; Richard L. Donaldson

[57] ABSTRACT

One embodiment of the instant invention is an electrostatic discharge protection device (10) which includes a field-effect transistor, the field-effect transistor comprising: a substrate (12) of a first conductivity type and having a surface and a backside; a gate structure (18) insulatively disposed on the substrate; a blocking region (30) disposed on the substrate and adjacent to the gate structure; a lightly-doped region (32) of a second conductivity type opposite the first conductivity type and disposed within the substrate and beneath the blocking region; a channel region (14) disposed within the substrate, under the gate structure, and adjacent the lightly-doped region; a first doped region (38) of the second conductivity type and disposed within the substrate and adjacent to the lightly doped region, the first doped region spaced away from the channel region by the lightly-doped region; and a second doped region (22) of the second conductivity type and disposed within the substrate, the second doped region spaced away from the first doped region by the channel region. Preferably, a first bipolar transistor (210) is integrated into the electrostatic discharge device and is formed by the substrate, the lightly-doped region and the second doped region and a second bipolar transistor (212) is integrated into the electrostatic discharge device and is formed by the substrate, the first doped region and the second doped region, the first bipolar transistor becoming conductive at a lower voltage during an ESD event than the second bipolar transistor but the second bipolar transistor able to carry more current during the ESD event.

15 Claims, 1 Drawing Sheet

INTEGRATED LATERAL STRUCTURE FOR ESD PROTECTION IN CMOS/BICMOS TECHNOLOGIES

This application claims priority under 35 USC § 119(e)(1) of provisional application No. 60/007,110, filed Oct. 31, 1995.

FIELD OF THE INVENTION

The instant invention pertains to semiconductor devices and more specifically to a lateral structure which provides ESD protection in CMOS/BiCMOS technologies.

BACKGROUND OF THE INVENTION

Silicide technologies provide for lower source/drain contact resistances in semiconductor device. Such lower resistance is important for device operation but the use of silicided regions in the device greatly reduces the capability of the device to withstand high current. Hence, it is difficult to manufacture effective ESD protection circuits using standard devices which implement silicide technologies.

Silicide can be blocked from regions close to the conductive gate structure of a transistor in order to increase the high current carrying capability of the transistor. However, this solution on its own has the problem that it requires that the area of the protection device be increased in order to accommodate the silicide block. If the intrinsic ESD capability of the protection device is not substantially increased, it is possible that this increase in area may not gain sufficient benefit to offset the increased cost of implementing silicide block into the process.

It is, therefore, an object of the instant invention to provide an ESD protection device(s) which includes silicided regions while increasing the ESD capabilities and thresholds of the protection device(s). It is another object of the instant invention to provide a physically-smaller ESD protection device which has increased ESD thresholds as compared to traditional devices.

SUMMARY OF THE INVENTION

One embodiment of the instant invention is an electrostatic discharge protection device which includes a field-effect transistor, the field-effect transistor comprising: a substrate of a first conductivity type and having a surface and a backside; a gate structure insulatively disposed on the substrate; a blocking region disposed on the substrate and adjacent to the gate structure; a lightly-doped region of a second conductivity type opposite the first conductivity type and disposed within the substrate and beneath the blocking region; a channel region disposed within the substrate, under the gate structure, and adjacent the lightly-doped region; a first doped region of the second conductivity type and disposed within the substrate and adjacent to the lightly doped region, the first doped region spaced away from the channel region by the lightly-doped region; and a second doped region of the second conductivity type and disposed within the substrate, the second doped region spaced away from the first doped region by the channel region. Preferably, a first bipolar transistor is integrated into the electrostatic discharge device and is formed by the substrate, the lightly-doped region and the second doped region and a second bipolar transistor integrated into the electrostatic discharge device and is formed by the substrate, the first doped region and the second doped region, the first bipolar transistor becoming conductive at a lower voltage during an ESD event than the second bipolar transistor but the second bipolar transistor able to carry more current during the ESD event. Preferably, the first bipolar transistor is a lateral bipolar transistor, or the first bipolar transistor is a lateral bipolar npn transistor. In addition, the second bipolar transistor is, preferably, a lateral bipolar transistor, or the second bipolar transistor is a lateral bipolar npn transistor.

Another embodiment of the instant invention is an electrostatic discharge protection device which includes a field-effect transistor, the field-effect transistor comprising: a substrate of a first conductivity type and having a surface and a backside; a gate structure insulatively disposed on the substrate; a channel region disposed within the substrate and under the gate structure; a lightly-doped region of a second conductivity type opposite the first conductivity type and disposed within the substrate and adjacent the channel region; a first doped region of the second conductivity type and disposed within the substrate and adjacent to the lightly doped region, the first doped region spaced away from the channel region by the lightly-doped region; a silicided region formed at the surface of the substrate within the first doped region, the silicided region spaced from the gate structure by the lightly-doped region; and a second doped region of the second conductivity type and disposed within the substrate, the second doped region spaced away from the first doped region by the channel region. Preferably, a first bipolar transistor is integrated into the electrostatic discharge device and is formed by the substrate, the lightly-doped region and the second doped region and a second bipolar transistor integrated into the electrostatic discharge device and is formed by the substrate, the first doped region and the second doped region, the first bipolar transistor becoming conductive at a lower voltage during an ESD event than the second bipolar transistor but the second bipolar transistor able to carry more current during the ESD event. Preferably, the first bipolar transistor is a lateral bipolar transistor, or the first bipolar transistor is a lateral bipolar npn transistor. In addition, the second bipolar transistor is, preferably, a lateral bipolar transistor, or the second bipolar transistor is a lateral bipolar npn transistor.

Another embodiment of the instant invention is an electrostatic discharge protection device which includes a field-effect transistor, the field-effect transistor comprising: a substrate of a first conductivity type and having a surface and a backside; a gate structure insulatively disposed on the substrate; a channel region disposed within the substrate and under the gate structure; a lightly-doped region of a second conductivity type opposite the first conductivity type and disposed within the substrate and adjacent the channel region; a first doped region of the second conductivity type and disposed within the substrate and adjacent to the lightly doped region, the first doped region spaced away from the channel region by the lightly-doped region; and a second doped region of the second conductivity type and disposed within the substrate, the second doped region spaced away from the first doped region by the channel region. Preferably, a first bipolar transistor is integrated into the electrostatic discharge device and is formed by the substrate, the lightly-doped region and the second doped region and a second bipolar transistor integrated into the electrostatic discharge device and is formed by the substrate, the first doped region and the second doped region, the first bipolar transistor becoming conductive at a lower voltage during an ESD event than the second bipolar transistor but the second bipolar transistor able to carry more current during the ESD event. Preferably, the first bipolar transistor is a lateral bipolar transistor, or the first bipolar transistor is a lateral bipolar npn transistor. In addition, the second bipolar transistor is, preferably, a lateral bipolar transistor, or the second bipolar transistor is a lateral bipolar npn transistor.

DETAILED DESCRIPTION OF THE DRAWINGS

Figure 1:
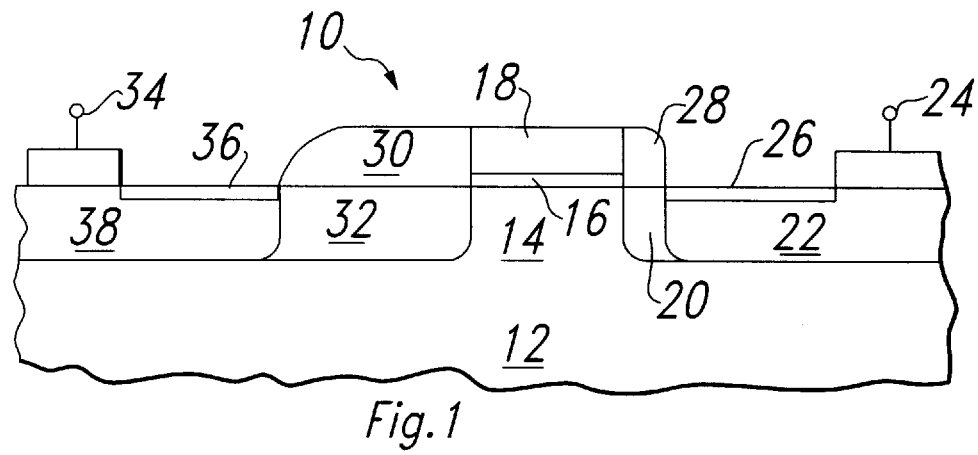
FIG. 1 is a cross-sectional view of an ESD protection device according to an embodiment of the instant invention.

FIG. 1 illustrates a cross-sectional view of the structure of ESD protection device 10. ESD protection device 10 is an FET which is preferably comprised of two lateral npn transistors (shown in FIG. 2 as transistors 210 and 212). ESD protection device is formed on and within substrate 12 (preferably p-type substrate). Within substrate 12, lightly doped regions 32 and 20 (preferably n LDD's) are formed. Lightly doped region 20 is optionally formed. Lightly doped regions 20 and 32 are preferably formed by implanting phosphorous in the substrate at a concentration of $3 \times 10^{13}$ to $5 \times 10^{14} cm^{-2}$ at an energy level around 60 keV. In the alternative, lightly doped regions 20 and 32 may be comprised of arsenic instead of phosphorous. Lightly doped regions 20 and 32 are preferably formed after the formation of conductive gate structure 18 (preferably comprised of polysilicon or another conductive material) and gate insulator 16 (preferably a thin layer of oxide or nitride) but before the formation of sidewall insulator 28 and blocking region 30, respectively. Blocking region 30 may be comprised of a nitride, an oxide, undoped polysilicon, or photoresist. In fact, blocking region 30 may be formed after the formation of lightly doped region 32 and later removed, after the formation of silicided regions 26 and 36. After the formation of blocking region 30 and sidewall insulator 28, source/drain regions 22 and 38 are formed (preferably n+regions). Preferably, region 22 is the source region and region 38 represents the drain region. Regions 22 and 38 are, preferably, formed by implanting arsenic in the substrate at a dose of approximately $1 \times 10^{15}$ to $5 \times 10^{15}$ cm$^{-2}$ at an energy of approximately 50 to 100 keV. After the formation of source/drain regions 22 and 38, silicide regions 26 and 36 are formed within source/drain regions 22 and 38, respectively. As is commonly known in the art, at least a portion of silicide regions 26 and 36 will consume some of the silicon of source/drain regions 22 and 38. Silicide region 36 is aligned with respect to blocking region 30 so that silicide region 36 is spaced away from conductive gate structure 18. This is important because it increases the current-carrying capability of ESD protection device 10. Once silicide regions 26 and 36 are formed, source contact 24 and drain contact 34 are formed.

Figure 2:
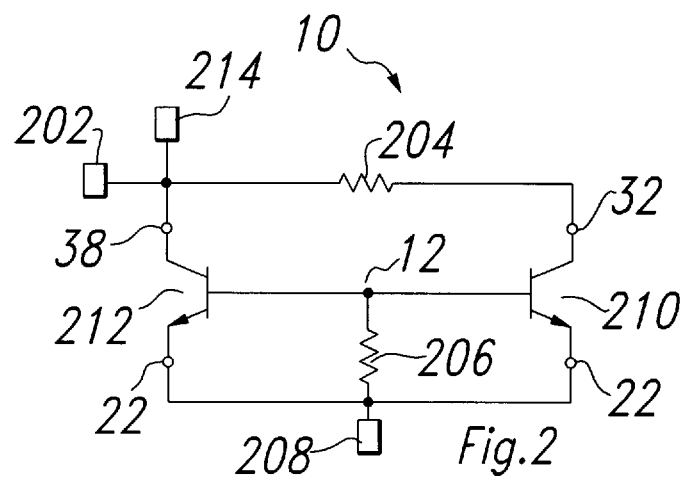
FIG. 2 is a schematic diagram of the ESD protection device of FIG. 1.

FIG. 2 is a schematic diagram relating to ESD protection device 10 of FIG. 1. Due to the unique structure of ESD protection device 10, it is comprised of two lateral transistors, transistor 210 and transistor 212. In FIG. 2, block 202 represents the pad in which the ESD is introduced, however this pad is meant to be a contact for a supply. Block 214 represents the circuit or circuits to be protected. More specifically, block 214 represents the gates of the circuit(s) to be protected. Block 208 represents the pad in which $V_{SS}$ (preferably ground) is connected.

The base of transistors 210 and 212 is the substrate, and the connection to these bases is made via the substrate contact region (preferably the back side of the wafer). Preferably, the substrate contact is grounded. The emitter of transistor 212 is formed by source/drain region 22 and the collector of transistor 212 is formed by source/drain region 38. The emitter of transistor 210 is formed from region 20. If region 20 is not formed, then the emitter of transistor 210 is formed from source/drain region 22. The collector of transistor 210 is formed from lightly doped region 32.

Transistor 212 is a more robust device than transistor 210. In other words, since transistor 212 is formed farther from the surface of the substrate than transistor 210 (which is formed closer to the surface of the substrate), transistor 212 can handle greater currents then transistor 210. However, transistor 212 is triggered at a higher voltage than transistor 210, because the turn-on takes place at the bottom of the junctions whereas transistor 210 is a surface device.

Integrated resistor 204 is preferably formed from the resistance of lightly doped region 32. Integrated resistor 204 is not a discrete resistor, it is the resistance of the path from terminal 34 through lightly doped region 32 to lightly doped region 14. Resistor 206 represents the resistance of the substrate.

Figure 3:
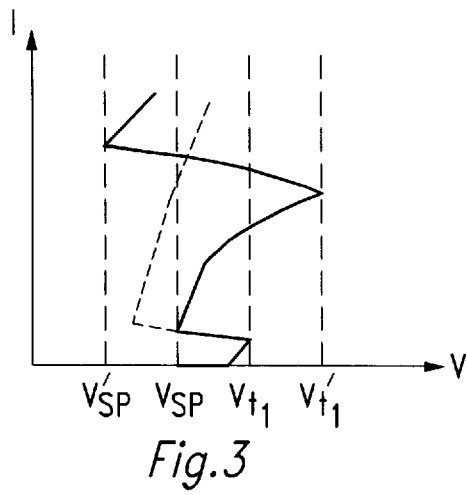
FIG. 3 is a graph illustrating the performance of the ESD protection device of the instant invention as compared to a traditional device.
Figure 3A:
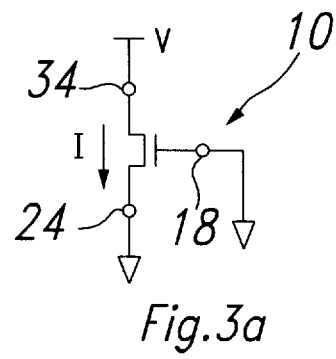
FIG. 3a illustrates the sources for the measurements depicted on the x-axis and y-axis.

FIG. 3 is a graph depicting drain current versus drain voltage for the ESD protection device of FIG. 1. As is shown in FIG. 3a, source contact 24 is preferably tied to ground in the graphic representation of FIG. 3. Gate 18 can be tied to ground or connected to other circuitry not shown in the figure. The dotted-line graph in FIG. 3 represents traditional ESD protection devices, while the solid line represents the ESD protection device of FIG. 1. During an ESD event, the voltage at terminal 34 rises until it reaches the avalanche breakdown voltage of the junction between region 32 and region 14. At this point current begins to flow into substrate region 12. The voltage in substrate 12 increases until the junction between substrate 12 and region 20 (or region 22 if region 20 is not formed) is substantially forward biased thus turning on the lateral npn bipolar transistor 210, which is formed by region 32 as the collector, region 12 (or region 14) as the base, and region 20 (or region 22) as the emitter. The turn-on of bipolar transistor 210 causes the voltage at terminal 34 to reduce to $V_{sp}$ which is the "on" voltage of the lateral bipolar transistor. The current through region 32, which is denoted as resistor 204 in FIG. 2, raises the voltage at terminal 34. Because of the nature of the resistance formed by lightly doped region 32, resistance 204 will increase as the current increases. As the voltage at terminal 34 increases, the voltage between region 38 and region 12 also increases. Because of the increased resistance in region 32, and the higher electric field across the junction between region 34 and region 12, more of the electrons injected from region 22 will be collected by region 38 and bipolar transistor 212, which is formed by region 32 as collector, region 12 as base and region 22 (or region 20) as the emitter, will turn on. Transistor 212 has its active collector region substantially deeper than that of transistor 210, and hence has better heat dissipation and a higher current conduction capability than transistor 210. Thus the same device area is able to sustain a substantially higher ESD current than a structure which does not utilize this invention.

Still referring to FIG. 3, at $V_{t1}$, transistor 210 turns on and the voltage at the drain reduces to $V_{sp}$. As the current is increased further, the voltage increases, due to the current passing through the resistance of lightly doped region 32 (depicted as resistor 204 in FIG. 2), until a point, $V_{t1}'$. At $V_{t1}'$, transistor 212 turns on and the voltage "snaps back" to $V_{sp}'$. Transistor 212 is preferably a bulk action device (the conduction path of transistor 212 lies deeper within the substrate as opposed to closer to the surface of the substrate) and, therefore, allows better heat dissipation and much higher current conduction than a single transistor operating closer to the surface of the substrate.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. An electrostatic discharge protection device which includes a field-effect transistor, said field-effect transistor comprising:
    a substrate of a first conductivity type and having a surface and a backside;
    a gate structure insulatively disposed on said substrate;
    a blocking region disposed on said substrate and adjacent to said gate structure;
    a lightly-doped region of a second conductivity type opposite said first conductivity type and disposed within said substrate and beneath said blocking region;
    a channel region disposed within said substrate, under said gate structure, and adjacent said lightly-doped region;
    a first doped region of said second conductivity type and disposed within said substrate and adjacent to said lightly doped region, said first doped region spaced away from said channel region by said lightly-doped region,
    a second doped region of said second conductivity type and disposed within said substrate, said second doped region spaced away from said first doped region by said channel region; and
    wherein a first bipolar transistor is integrated into said electrostatic discharge device and is formed by said substrate, said lightly-doped region and said second doped region and a second bipolar transistor is integrated into said electrostatic discharge device and is formed by said substrate, said first doped region and said second doped region, said first bipolar transistor becoming conductive at a lower voltage during an ESD event than said second bipolar transistor but said second bipolar transistor able to carry more current than said first bipolar transistor during said ESD event.

2. The electrostatic discharge protection device of claim 1, wherein said first bipolar transistor is a lateral bipolar transistor.

3. The electrostatic discharge protection device of claim 2, wherein said first bipolar transistor is a lateral bipolar npn transistor.

4. The electrostatic discharge protection device of claim 1, wherein said second bipolar transistor is a lateral bipolar transistor.

5. The electrostatic discharge protection device of claim 4, wherein said second bipolar transistor is a lateral bipolar npn transistor.

6. An electrostatic discharge protection device which includes a field-effect transistor, said field-effect transistor comprising:
    a substrate of a first conductivity type and having a surface and a backside;
    a gate structure insulatively disposed on said substrate;
    a channel region disposed within said substrate and under said gate structure;
    a lightly-doped region of a second conductivity type opposite said first conductivity type and disposed within said substrate and adjacent said channel region;
    a first doped region of said second conductivity type and disposed within said substrate and adjacent to said lightly doped region, said first doped region spaced away from said channel region by said lightly-doped region;
    a silicided region formed at said surface of said substrate within said first doped region, said silicided region spaced from said gate structure by said lightly-doped region;
    a second doped region of said second conductivity type and disposed within said substrate, said second doped region spaced away from said first doped region by said channel region;
    and wherein a first bipolar transistor integrated into said electrostatic discharge device and is formed by said substrate, said lightly-doped region and said second doped region and a second bipolar transistor is integrated into said electrostatic discharge device and is formed by said substrate, said first doped region and said second doped region, said first bipolar transistor becoming conductive at a lower voltage than said second bipolar transistor during an ESD event but said second bipolar transistor able to carry more current during said ESD event.

7. The electrostatic discharge protection device of claim 6, wherein said first bipolar transistor is a lateral bipolar transistor.

8. The electrostatic discharge protection device of claim 7, wherein said first bipolar transistor is a lateral bipolar npn transistor.

9. The electrostatic discharge protection device of claim 6, wherein said second bipolar transistor is a lateral bipolar transistor.

10. The electrostatic discharge protection device of claim 9, wherein said second bipolar transistor is a lateral bipolar npn transistor.

11. An electrostatic discharge protection device which includes a field-effect transistor, said field-effect transistor comprising:
    a substrate of a first conductivity type and having a surface and a backside;
    a gate structure insulatively disposed on said substrate;
    a channel region disposed within said substrate and under said gate structure;
    a lightly-doped region of a second conductivity type opposite said first conductivity type and disposed within said substrate and adjacent said channel region;
    a first doped region of said second conductivity type and disposed within said substrate and adjacent to said lightly doped region, said first doped region spaced away from said channel region by said lightly-doped region;
    a second doped region of said second conductivity type and disposed within said substrate, said second doped region spaced away from said first doped region by said channel region;
    and wherein a first bipolar transistor integrated into said electrostatic discharge device and is formed by said substrate, said lightly-doped region and said second doped region and a second bipolar transistor is integrated into said electrostatic discharge device and is formed by said substrate, said first doped region and said second doped region, said first bipolar transistor becoming conductive at a lower voltage than said second bipolar transistor during an ESD event but said second bipolar transistor abie to carry more current during said ESD event.

12. The electrostatic discharge protection device of claim 11, wherein said first bipolar transistor is a lateral bipolar transistor.

13. The electrostatic discharge protection device of claim 12, wherein said first bipolar transistor is a lateral bipolar npn transistor.

14. The electrostatic discharge protection device of claim 11, wherein said second bipolar transistor is a lateral bipolar transistor.

15. The electrostatic discharge protection device of claim 14, wherein said second bipolar transistor is a lateral bipolar npn transistor.

* * * * *